United States Patent
Wang et al.

(10) Patent No.: US 7,253,481 B2
(45) Date of Patent: Aug. 7, 2007

(54) HIGH PERFORMANCE MOS DEVICE WITH GRADED SILICIDE

(75) Inventors: Chih-Hao Wang, Hsin-Chu (TW); Ta-Wei Wang, Taipei (TW); Ching-Wei Tsai, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/181,521

(22) Filed: Jul. 14, 2005

(65) Prior Publication Data

US 2007/0013010 A1    Jan. 18, 2007

(51) Int. Cl.
    *H01L 29/772* (2006.01)
(52) U.S. Cl. .............. 257/382; 257/384; 257/408; 257/344; 257/900; 257/E29.267
(58) Field of Classification Search ........... 257/649, 257/623, E29.259, 626, 344, 408, 409, 192, 257/E29.193, 19, 20, 900, 392, 339, E29.267, 257/382, 384; 438/302
    See application file for complete search history.

(56) References Cited

U.S. PATENT DOCUMENTS 5,998,839 A * 12/1999 Cho ........................... 257/347
6,017,801 A * 1/2000 Youn ......................... 438/296
6,191,462 B1 2/2001 Chen-Hua
6,498,067 B1 12/2002 Perng et al.
6,747,373 B1 6/2004 Hu et al.
6,870,179 B2 3/2005 Shaheed et al.
2003/0073270 A1* 4/2003 Hisada et al. ............... 438/197
2005/0258515 A1* 11/2005 Chidambarrao et al. .... 257/649
2006/0231826 A1* 10/2006 Kohyama ...................... 257/19

OTHER PUBLICATIONS

GE, C.-H., et al., "Process-Strained Si (PSS) CMOS Technology Featuring 3D Strain Engineering," IEDM, IEEE, 2003, pp. 73-76.
Thompson, S. E., et al., "A 90-nm Logic Technology Featuring Strained-Silicon," IEEE Transactions on Electron Devices, vol. 51, No. 11, Nov. 2004, pp. 1790-1797.

* cited by examiner

Primary Examiner—Matthew C. Landau
(74) Attorney, Agent, or Firm—Slater & Matsil, L.L.P.

(57) ABSTRACT

A semiconductor device suffering fewer current crowding effects and a method of forming the same are provided. The semiconductor device includes a substrate, a gate over the substrate, a gate spacer along an edge of the gate and overlying a portion of the substrate, a diffusion region in the substrate wherein the diffusion region comprises a first portion and a second portion between the first portion and the gate spacer. The first portion of the diffusion region has a recessed top surface. The semiconductor device further includes a silicide layer on the diffusion region, and a cap layer over at least the silicide layer. The cap layer provides a strain to the channel region of the semiconductor device.

16 Claims, 6 Drawing Sheets

HIGH PERFORMANCE MOS DEVICE WITH GRADED SILICIDE

TECHNICAL FIELD

This invention generally relates to semiconductor devices and fabrication processes, and particularly to semiconductor device having a strained layer over source/drain regions.

BACKGROUND

The scaling of VLSI circuits is a constant effort. With circuits becoming smaller and faster, device drive current improvement becomes more important. Among efforts being made to improve device drive current, forming a strained silicon channel, thus enhancing carrier mobility, is a known practice. Strain, sometimes referred to as stress, can enhance bulk electron and hole mobility. The performance of a MOS device can be enhanced through a strained-surface channel. This technique allows performance to be improved at a constant gate length, without adding complexity to circuit fabrication or design.

When silicon is placed under strain, the electron mobility is dramatically increased. One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of silicon, the silicon film is under biaxial tension and thus the carriers exhibit strain-enhanced mobility.

Strain can also be induced by forming a strained contact etch stop (CES) layer on a MOS device. When a contact etch stop layer is deposited, due to the lattice spacing mismatch between the CES layer and the underlying layer, an in-plane strain develops to match the lattice spacing. In the channel region, strain also develops as a response to the strain applied, and the carrier mobility is enhanced. Strain applied to the channel region is determined by the intrinsic strain in the CES layer and its thickness, and the intrinsic strain generally increases when the thickness of the CES layer increases.

While CES layers are desirable for strain engineering, very thick CES layers cause difficulty in subsequent processes, such as inter-layer dielectric (ILD) gap filling, and therefore are undesired in high-density circuit design. FIG. 1 illustrates a conventional method of improving strain without the necessity of increasing the thickness of the CES layer. After the formation of the spacers 4, an extra recess step is performed on the substrate 2 along edges of the respective spacers 4, forming recesses 6 in the source/drain regions 12. A strained CES layer 10 is then formed. Due to the recesses 6, strain applied on the channel region 8 by the CES layer 10 increases, and about a seven percent device drive current improvement has been observed due to the increased strain.

The drive current improvement is significant in large devices. In small devices, particularly devices manufactured using 65 nm technologies and beyond, the drive current improvement is less observable, even though the channel mobility is improved. A possible reason is that the recessing of the source/drain regions 12 causes current crowding effects in regions 16, which are substantially narrower portions of the source/drain regions 12, and the device drive current is degraded accordingly. The current crowding effects are especially severe in small devices. In devices manufactured using 90 nm technology, the device drive current degradation due to current crowding effects is less than about one percent. In devices manufactured using 65 nm technology, the device drive current is degraded about 12 percent. With the further scaling of the devices, the device drive currents are expected to degrade even more.

What is needed, therefore, is a method to increase the strain applied to the channel region while eliminating the detrimental current crowding effects, so that device drive currents are improved.

SUMMARY OF THE INVENTION

The preferred embodiments of the present invention provide a semiconductor device and a method of forming the same. The semiconductor device suffers fewer current crowding effects and has improved drive current.

In accordance with one aspect of the present invention, the semiconductor device includes a substrate, a gate over the substrate, a gate spacer along an edge of the gate and overlying the substrate, a diffusion region in the substrate wherein the diffusion region comprises a first portion and a second portion between the first portion and the gate spacer. The first portion of the diffusion region has a recessed top surface. The semiconductor device further includes a conductive layer on the diffusion region, and a cap layer over the conductive layer. Preferably, the conductive layer is a silicide layer. The cap layer provides a strain to the channel region of the semiconductor device. Preferably, the cap layer is a contact etch stop layer.

In accordance with another aspect of the present invention, the gate spacer includes a first portion and a second portion. The first and second portions preferably include materials having different etching characteristics.

In accordance with yet another aspect of the present invention, the method of forming the semiconductor device includes providing a substrate, forming a gate structure overlying the substrate, forming a sidewall spacer on a sidewall of the gate structure, removing an exposed portion of the substrate material to form a recess, thinning the sidewall spacer, forming a diffusion region in the semiconductor substrate, forming a silicide region on the diffusion region, and forming a cap layer having an inherent strain over the gate, the gate spacer and the source/drain region.

In accordance with yet another aspect of the present invention, the step of forming the sidewall spacer includes forming a first sidewall spacer on the sidewall of the gate and forming a second sidewall spacer along the first sidewall spacer, and the step of thinning the sidewall spacer includes removing a portion of the second sidewall spacer.

In accordance with yet another aspect of the present invention, the step of forming the sidewall spacer includes forming a first sidewall spacer on the sidewall of the gate and forming a second sidewall spacer along the first sidewall spacer, and the step of thinning the sidewall spacer includes removing substantially the entire second sidewall spacer.

The preferred embodiments of the present invention reduce current crowding effects, so that the device drive current is improved. Leakage current is also reduced due to increased distance between the (source/drain) silicide regions and respective junctions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
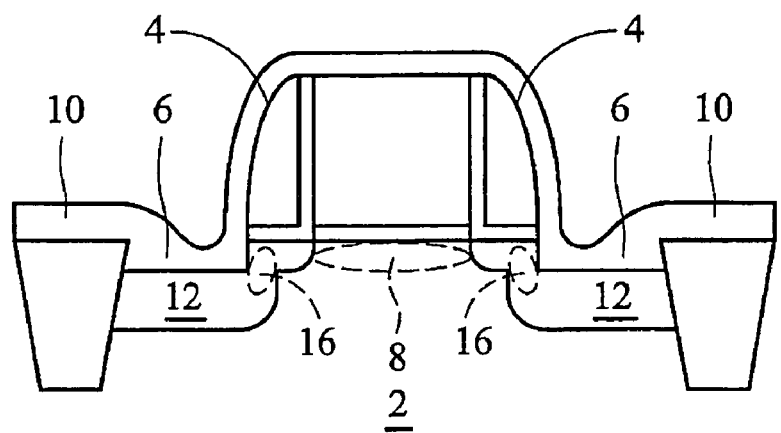
FIG. 1 illustrates a conventional method of improving strain in a MOS device by recessing source/drain regions.
Figure 2:
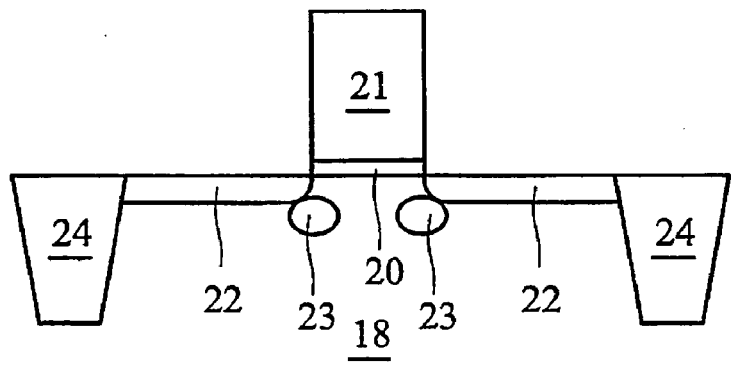
FIGS. 2 through 10 are cross-sectional views of intermediate stages in the manufacture of a preferred embodiment, wherein a disposable sidewall spacer is formed substantially entirely removed in subsequent steps.

FIG. 2 illustrates the formation of a gate stack comprising a gate dielectric 20 and a gate electrode 21 on a substrate 18. The gate dielectric 20 preferably has high dielectric constant (k value). In the preferred embodiment, the substrate 18 comprises bulk silicon. In alternative embodiments, other commonly used materials and structures, such as germanium, SiGe, strained silicon on SiGe, silicon on insulator (SOI), silicon germanium on insulator (SGOI), germanium on insulator (GOI), and the like, can also be used. Shallow trench isolation regions (STI) 24 are formed in the substrate 18 to isolate subsequently formed devices. Typically, the formation of STIs 24 includes etching trenches in the substrate 18 and filling the trenches with dielectric materials.

Lightly doped drain/source (LDD) regions 22 are formed in the substrate 18, preferably by implanting appropriate impurities using the gate electrode 21 as a mask. Optionally, halo regions 23 having an impurity type opposite the type of impurities in the LDD regions 22 are formed. Halo regions 23 are used for neutralizing the impurity of the LDD regions and the subsequently formed heavily doped source/drain regions, so that the LDD regions and heavily doped source/drain regions have greater abruptness on their borders. Halo regions 23 are preferably located close to the borders of the respective LDD regions 22 and subsequently formed source/drain regions. As is known in the art, by adjusting the implanting energy level and impurity elements, impurities can be implanted to desired depths, preferably with the center of the distribution region close to the desired border of the LDD regions 22 and subsequently formed source/drain regions.

Figure 3:
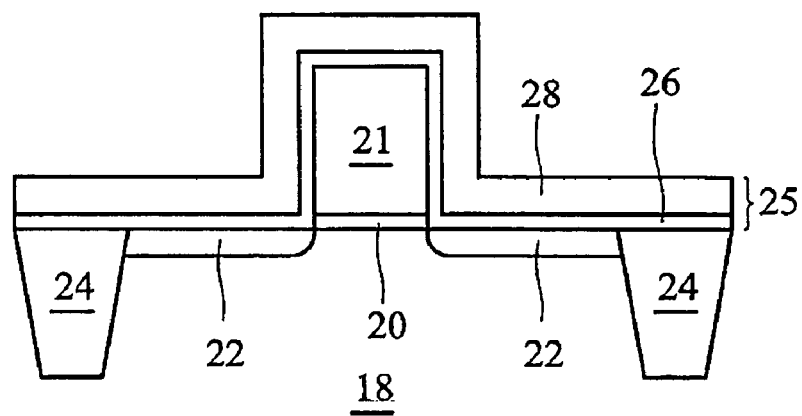

FIG. 3 illustrates the formation of a dummy layer 25, which is used for forming spacers. In the preferred embodiment, the dummy layer 25 includes a liner oxide layer 26, sometimes referred to as an adhesion layer, and a nitride layer 28. Preferably, the liner oxide layer 26 has better adhesion to the gate electrode 21 than the nitride layer 28 adheres to the gate electrode 21. In alternative embodiments, the dummy layer 25 may include single or composite layers comprising oxide, silicon nitride, silicon oxynitride (SiON) and/or other low-k materials, and may be formed using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), etc.

Figure 4:
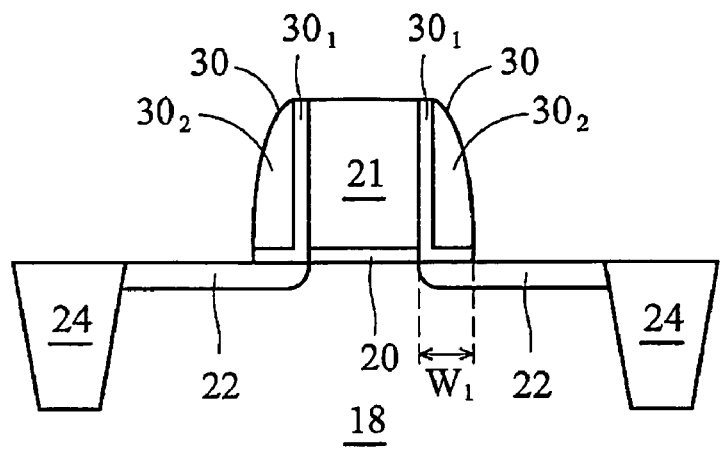

FIG. 4 illustrates the liner oxide layer 26 and nitride layer 28 being patterned and etched to form gate spacers 30. Either wet etching or dry etching can be used. The resulting spacers 30 comprise liner oxide portions $30_1$ and nitride portions $30_2$. Preferably, the thickness $W_1$ of the spacers 30 is between about 15 nm and about 75 nm.

Figure 5:
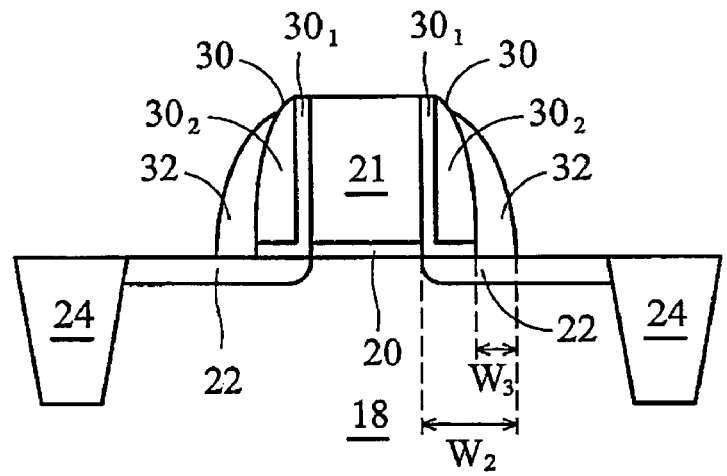

Disposable spacers 32 are then formed along outer edges of the respective spacers 30, as illustrated in FIG. 5. Disposable spacers 32 preferably comprise materials having different etching characteristics from the materials used to form gate spacers 30, particularly the spacer portions $30_2$, so that disposable spacers 32 can be removed or thinned without damaging the gate spacers 30. In the preferred embodiment, the disposable spacers 32 are formed of oxide. Preferably, the thickness $W_3$ of the disposable spacers 32 is between about 1 nm and 55 nm. Also, the combined width $W_2$ of the gate spacers 30 and disposable spacers 32 are preferably less than about 80 nm, and more preferably between about 30 nm and 80 nm.

Figure 6:
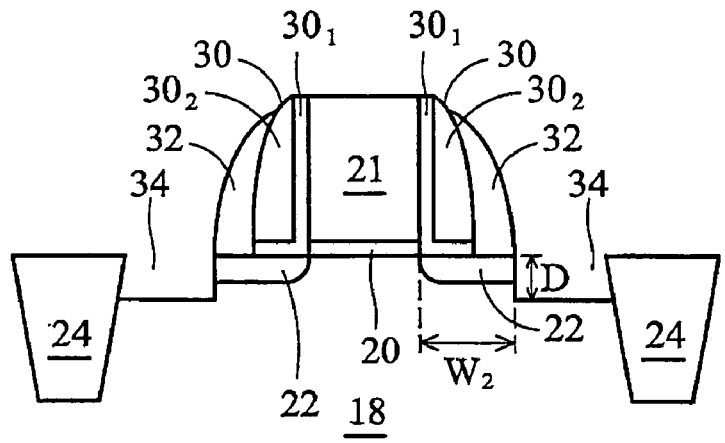

FIG. 6 illustrates the formation of recesses 34. The substrate 18 is preferably etched anisotropocally along edges of the disposable spacers 32 to form the recesses 34, which preferably extend from the respective edges of the disposable spacers 32 to the respective STI regions 24. Recesses 34 preferably have a depth D of less than about 50 nm, and more preferably between about 1 nm and about 30 nm. Further discussion regarding the recessing depth D and width $W_2$ are provided in subsequent paragraphs.

Figure 7:
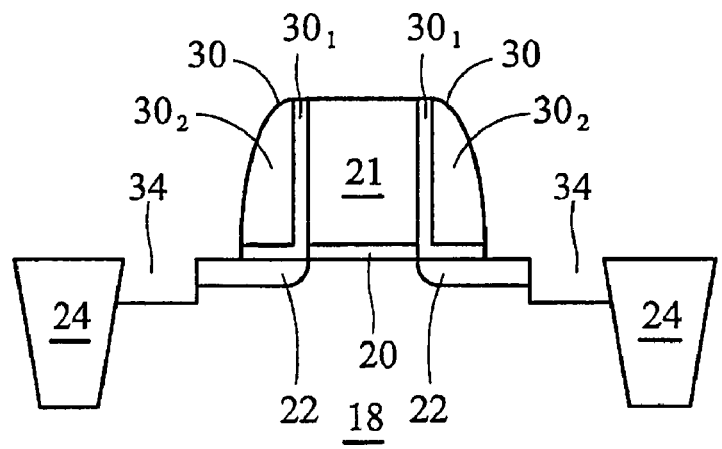

The disposable spacers 32 are then removed, as shown in FIG. 7. In the preferred embodiment, wet etching is performed and a suitable etchant is chosen based on the material of the disposable spacers 32. For example, an HF-containing etchant is used for stripping disposable spacers 32 that comprise oxides, while an $H_3PO_4$-containing etchant is preferably used for etching silicon nitride based spacers.

Figure 8:
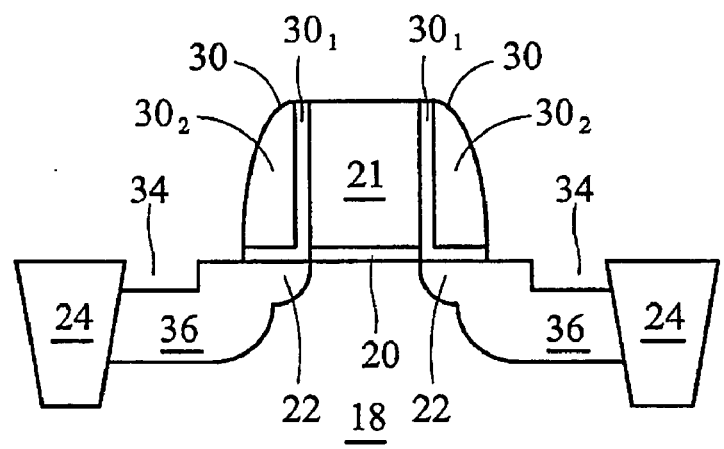

Source/drain regions 36, sometimes referred to as diffusion regions, are then formed, as shown in FIG. 8, preferably by implanting appropriate impurities using the gate spacers 30 and gate electrode 21 as masks. Although in the preferred embodiment, the source/drain regions 36 are formed after the removal of the disposable spacers 32, in other embodiments, the source/drain regions 36 can be formed before the disposable spacers 32 are removed.

Figure 9:
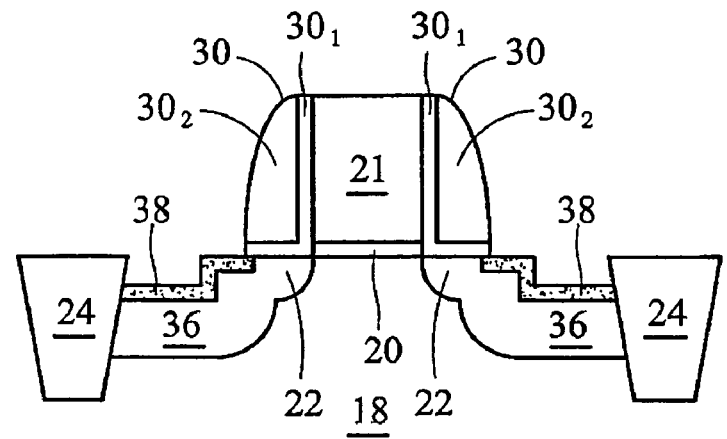

A conductive region 38 is formed, as illustrated in FIG. 9. The conductive region 38 is preferably a silicide region, and also preferably comprises nickel. However, other commonly used metals such as titanium, cobalt, palladium, platinum, erbium, and the like, can also be used to form silicides. As is known in the art, the silicidation is preferably performed by blanket deposition of an appropriate metal layer, followed by an annealing step in which the metal reacts with the underlying exposed silicon. Un-reacted metal is then removed, preferably with a selective etch process, and the silicide regions 38 are left. The thickness of the silicide regions 38 is preferably between about 5 nm and about 50 nm. The silicide regions 38 are graded due to the step heights of the source/drain regions 36.

Figure 10:
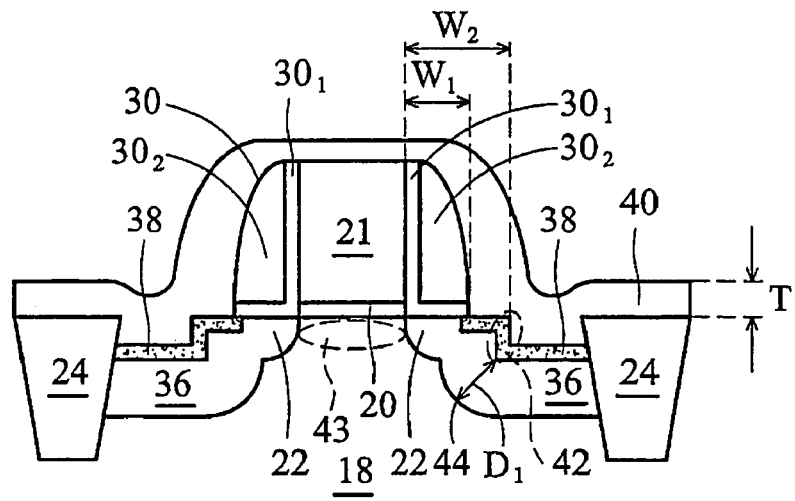

Next, as shown in FIG. 10, a cap layer 40, sometimes referred to as a "strain inducing layer" 40 is formed. Although this layer is preferably a contact etch stop (CES) layer and is interchangeably referred to as CES layer 40 throughout the description, it can be any strained layer or layers, even if the layer does not perform an etch stop function. The cap layer 40 may also be a composite layer comprising a CES layer and other layers. The type and strength of the strain are determined by the deposition process and materials used. Preferably, nitride, oxynitride, and the like, are used. The thickness T of the cap layer 40 is preferably greater than the depth D of the recesses 34 (please refer to FIG. 6). Also, the thickness T is preferably between about 100 nm and about 1200 nm.

It is observed that by forming gate spacers 30 and disposable spacers 32, the preferred embodiments of the present invention have the effect of shifting the silicide portion 42 away from the channel region 43 by a distance of $(W_2-W_1)$. The distance $D_1$ between the silicide regions 42 and the nearest border 44, or the junction, of the source/drain regions 36 is therefore increased. As a result, the current crowding effects are reduced and the device drive current is improved. A further advantage of the preferred embodiments of the present invention is that the leakage current flowing from the silicide regions 38 to the substrate 18 is also reduced due to the increased distance between the silicide regions 38 and junctions, which are located at the borders 44.

In order to increase the strain applied to the channel region 43, the distance $W_2$ (as shown in FIG. 6) is preferably small. However, the crowding effects increase when the distance $W_2$ decreases, and the saturation current $I_{dsat}$ (not shown) is adversely affected. Therefore, the beneficial effects caused by the increased strain are offset somewhat. The determination of the distance $W_2$ has to take both factors into account. Preferably, in 65 nm technology, the distance $W_2$ is less than about 70 nm, and more preferably between about 30 and 70 nm.

The strain introduced to the channel region and the drain saturation current $I_{dsat}$ of the device are related to the recessing depth D (please refer to FIG. 6).Having a greater recessing depth D increases the strain in the channel. However, the likelihood of current crowding also increases since the silicide regions are closer to the respective junctions when the recessing depth D increases. Considering that increased distance $W_2$ reduces the likelihood of the current crowding, balanced D and $W_2$ values will provide optimal effects. The optimal values of the $D/W_2$ ratio can be found through experiments. In the preferred embodiment, the ratio of $D/W_2$ is between about 1/7 and 3/7.

Figure 11:
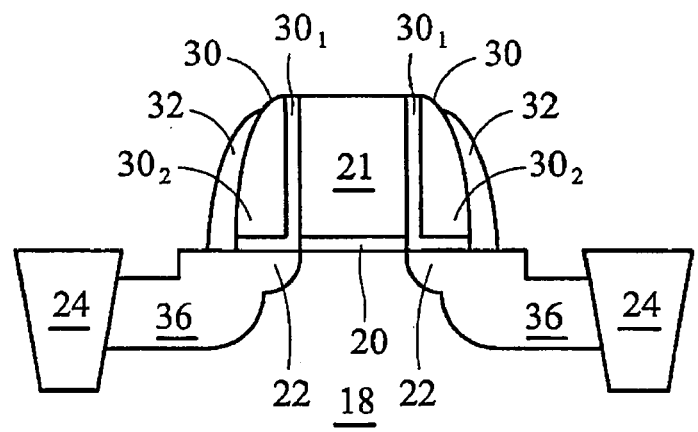
FIGS. 11 through 13 illustrate cross-sectional views of intermediate stages in the manufacture of another preferred embodiment, wherein a disposable sidewall spacer is formed and partially removed in subsequent steps.
Figure 12:
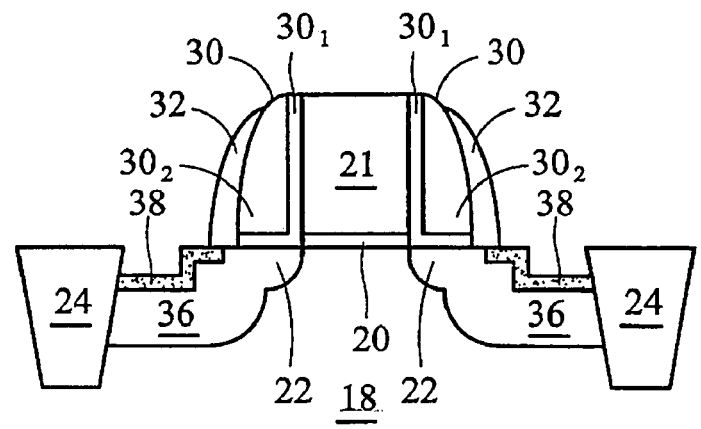
Figure 13:
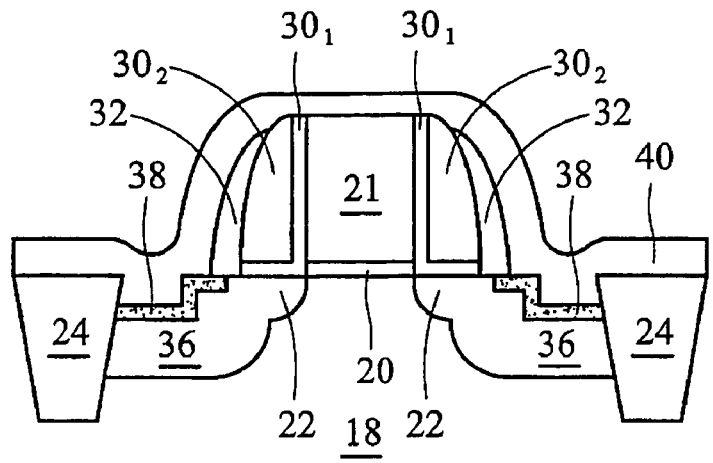

In another embodiment of the present invention, after the structure shown in FIG. 6 is formed, an outer portion of the spacers 32 is stripped, preferably by dry etching, and the spacers 32 become thinner. Wet etching can also be used. The resulting structure is shown in FIG. 11. Adjusting etching time is a preferred way of controlling the thinning of the spacers. FIGS. 12 and 13 illustrate structures after the formation of silicide regions 38 and cap layer 40, respectively.

Figure 14:
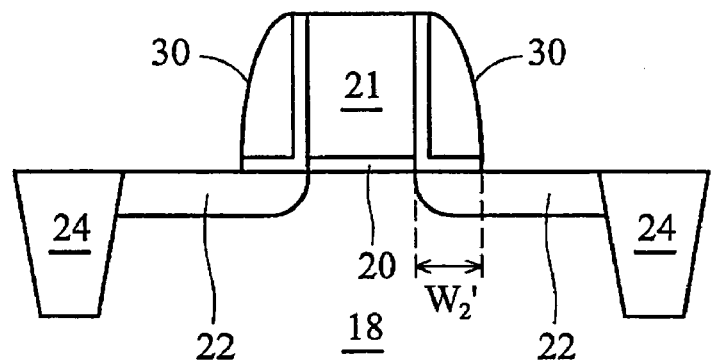
FIGS. 14 through 16 are cross-sectional views of intermediate stages in a variation of the preferred embodiment, wherein a sidewall spacer is formed, and an outside portion of the sidewall spacer is removed in subsequent steps.
Figure 15:
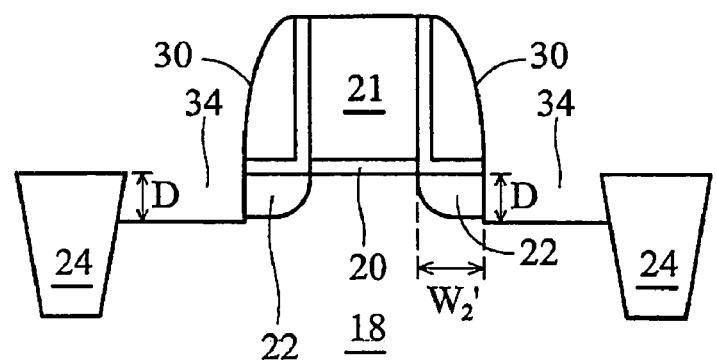
Figure 16:
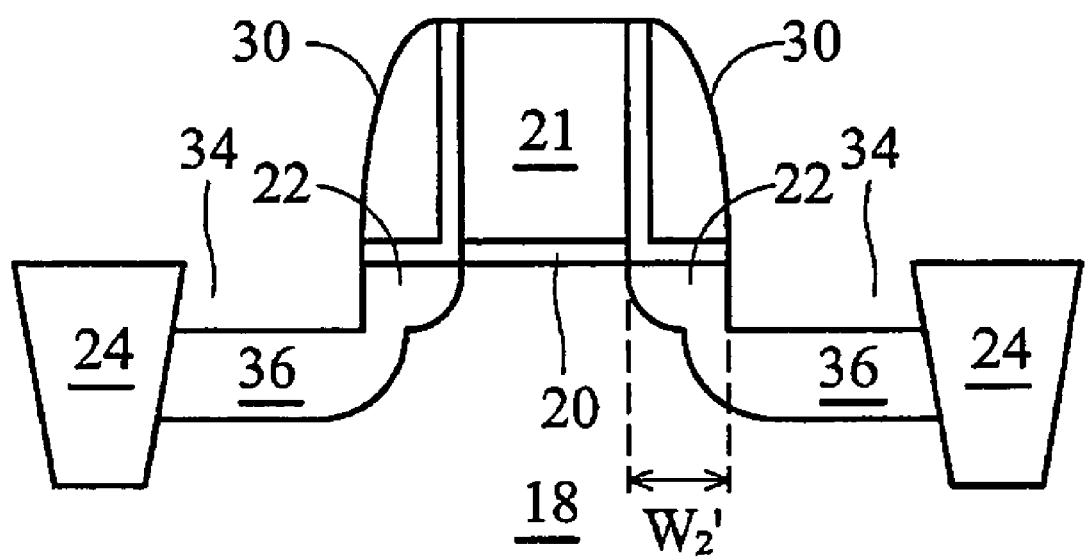

FIGS. 14 through 16 illustrate yet another embodiment of the present invention. The initial steps of this embodiment are similar to those shown in FIG. 2 through 4, and FIG. 14 illustrates a resulting structure. However, the thickness $W_2'$ of the spacers 30 is preferably greater than the thickness $w_1$ as shown in FIG.4, and preferably has a similar value to $W_2$ as in the previously discussed embodiment. FIGS. 15 and 16 illustrate the formation of the recesses 34, which have depth D, and source/drain regions 36, respectively. The gate spacers 30 are then thinned to the thickness $W_1$. The resulting structure is the same as shown in FIG. 8. In the preferred embodiment, spacer portion $30_1$ comprises oxide, while spacer portion $30_2$ comprises nitride, and wet etching using an $H_3PO_4$-containing etchant can be performed to remove outer portions of the spacers 30. The ratio of $W_1/W_2'$ can be controlled by adjusting can be illustrated in FIG. 9 and 10, respectively. The requirements of the materials, dimensions and forming methods have been discussed in the previously discussed embodiment, and thus are not repeated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   a gate over the substrate;
   a spacer liner along an edge of the gate and overlying a portion of the substrate, wherein the spacer liner has a horizontal leg and a vertical leg;
   a gate spacer on the horizontal leg of the spacer liner and comprising a different material from the spacer liner; and
   a diffusion region in the substrate with a conductive layer thereon, the conductive layer comprising a first portion, and a second portion having a substantially flat top surface between the first portion and the gate spacer, wherein the first portion has a top surface that is lower than the top surface of the second portion by a step height.

2. The semiconductor device of claim 1 wherein the step height is between about 1 and about 30 nm.

3. The semiconductor device of claim 1 wherein the conductive layer has a thickness of between about 5 nm and about 50 nm.

4. The semiconductor device of claim 1 further comprising a cap layer overlying the substrate, the gate, the gate spacer and the diffusion region.

5. The semiconductor device of claim 1, wherein the conductive layer is free from a region over the gate spacer.

6. The semiconductor device of claim 1 further comprising:
   an additional spacer liner along an edge of the gate and overlying a portion of the substrate, wherein the additional spacer liner has a horizontal leg and a vertical leg; and
   an additional gate spacer on the horizontal leg of the additional spacer liner, wherein the additional spacer liner and the additional gate spacer are on opposite sides of the gate than the spacer liner and the gate spacer, respectively.

7. The semiconductor device of claim 1, wherein the first portion and the second portion of the conductive layer have an interface at a distance from a respective edge of the gate, and wherein the step height and the distance have a ratio of between about 1/7 and about 3/7.

8. A semiconductor device comprising:
a substrate;
a gate over the substrate;
a spacer liner along an edge of the gate and overlying a portion of the substrate, wherein the spacer liner has a horizontal leg and a vertical leg;
a gate spacer on the horizontal leg of the spacer liner, wherein the spacer liner and the gate spacer comprise different materials;
a diffusion region in the substrate with a conductive layer thereon, the conductive layer comprising a first portion and a second portion between the first portion and the gate spacer, wherein the first portion has a top surface that is lower than a top surface of the second portion by a step height, and wherein the second portion has a substantially flat surface; and
wherein the first portion and the second portion of the conductive layer have an interface at a first distance from a respective edge of the gate, and wherein the step height and the first distance have a ratio of between about 1/7 and about 3/7.

9. The semiconductor device of claim 8 wherein the gate spacer has a thickness of greater than about 15 nm.

10. The semiconductor device of claim 8 wherein the first distance is less than about 70 nm.

11. The semiconductor device of claim 8 wherein the first portion and the second portion of the conductive layer have an interface at a second distance from an outer edge of the gate spacer, and wherein the second distance is between about mm and about 55 mn.

12. The semiconductor device of claim 8 wherein the gate spacer comprises a first portion along the edge of the gate and a second portion along an outer edge of the first portion.

13. The semiconductor device of claim 8 wherein the conductive layer is a suicide layer.

14. A semiconductor device comprising:
a substrate;
a gate over the substrate;
a first gate spacer along an edge of the gate and overlying a portion of the substrate, wherein the first gate spacer comprises a spacer liner having a vertical portion and a horizontal portion, and an additional portion on the horizontal portion of the spacer liner, and wherein the additional portion and the spacer liner comprise different materials;
a second gate spacer on a sidewall of the first gate spacer, the second gate spacer having a batten, surface in contact with the substrate; and
a source/drain region in the substrate with a conductive layer thereon, the conductive layer comprising a first portion, and a second portion having a substantially flat top surface between the first portion and the second gate spacer, wherein the first portion has a top surface that is lower than the top surface of the second portion by a step height.

15. The semiconductor device of claim 14, wherein the first and the second gate spacers have different etching characteristics.

16. The semiconductor device of claim 14, wherein the first portion and the second portion of the conductive layer have an interface at a distance from a respective edge of the gate, and wherein the step height and the distance have a ratio of between about 1/7 and about 3/7.

* * * * *

UNITED STATES PATENT AND TRADEMARK OFFICE
CERTIFICATE OF CORRECTION

PATENT NO. : 7,253,481 B2 Page 1 of 1
APPLICATION NO. : 11/181521
DATED : August 7, 2007
INVENTOR(S) : Wang et al.

It is certified that error appears in the above-identified patent and that said Letters Patent is hereby corrected as shown below:

In Col. 6, line 1, delete "adjusting can" and insert --adjusting etching time. Silicide regions 38 and cap layer 40 are then formed, and the resulting structures can--.
In Col. 6, line 43, delete "1 and" and insert --1 nm and--.
In Col. 7, line 30, delete "mm" and insert --1 nm--.
In Col. 7, line 30, delete "55 mn" and insert --55 nm--.
In Col. 8, line 2, delete "suicide" and insert --silicide--.
In Col. 8, line 14, delete "batten," and insert --bottom--.

Signed and Sealed this

Thirteenth Day of November, 2007

JON W. DUDAS
*Director of the United States Patent and Trademark Office*

UNITED STATES PATENT AND TRADEMARK OFFICE
CERTIFICATE OF CORRECTION

PATENT NO.       : 7,253,481 B2                                               Page 1 of 1
APPLICATION NO.  : 11/181521
DATED            : August 7, 2007
INVENTOR(S)      : Wang et al.

It is certified that error appears in the above-identified patent and that said Letters Patent is hereby corrected as shown below:

In Col. 6, line 1, delete "adjusting can" and insert --adjusting etching time. Silicide regions 38 and cap layer 40 are then formed, and the resulting structures can--.
In Col. 6, line 43, delete "1 and" and insert --1 nm and--.
In Col. 7, line 30, delete "mm" and insert --1 nm--.
In Col. 7, line 30, delete "55 mn" and insert --55 nm--.
In Col. 8, line 2, delete "suicide" and insert --silicide--.
In Col. 8, line 14, delete "batten," and insert --bottom--.

Signed and Sealed this

Twenty-seventh Day of November, 2007

JON W. DUDAS
*Director of the United States Patent and Trademark Office*